US010003336B1

(12) United States Patent
Wang et al.

(10) Patent No.: US 10,003,336 B1
(45) Date of Patent: Jun. 19, 2018

(54) INTEGRATED DRIVER AND TERMINATION CIRCUIT

(71) Applicant: Xilinx, Inc., San Jose, CA (US)

(72) Inventors: Xiaobao Wang, Cupertino, CA (US); VSS Prasad Babu Akurathi, Hyderabad (IN); Sasi Rama S. Lanka, Challapalli (IN)

(73) Assignee: XILINX, INC., San Jose, CA (US)

( * ) Notice: Subject to any disclaimer, the term of this patent is extended or adjusted under 35 U.S.C. 154(b) by 12 days.

(21) Appl. No.: 15/458,678

(22) Filed: Mar. 14, 2017

(51) Int. Cl.
| H03K 19/017 | (2006.01) |
| H03K 19/00 | (2006.01) |
| H03K 19/0175 | (2006.01) |
| H03K 19/177 | (2006.01) |

(52) U.S. Cl.
CPC . *H03K 19/0005* (2013.01); *H03K 19/017509* (2013.01); *H03K 19/1776* (2013.01); *H03K 19/17724* (2013.01); *H03K 19/17744* (2013.01)

(58) Field of Classification Search
CPC ....... H03K 19/0005; H03K 19/017509; H03K 19/17724; H03K 19/17744; H03K 19/1776
See application file for complete search history.

(56) References Cited

U.S. PATENT DOCUMENTS

2008/0303546 A1* 12/2008 Millar .................... G11C 5/063
326/30
2014/0184523 A1* 7/2014 McCall .............. H03K 19/0005
345/173

* cited by examiner

*Primary Examiner* — Alexander H Taningco
*Assistant Examiner* — Seokjin Kim
(74) *Attorney, Agent, or Firm* — LeRoy D. Maunu

(57) ABSTRACT

A pull-up leg of disclosed circuitry includes a pull-up pre-driver and a pull-up driver coupled to the pull-up pre-driver. A pull-down leg includes a pull-down pre-driver and a pull-down driver coupled to the pull-down pre-driver. An input/output pad is coupled between the pull-up driver and pull-down driver. A driver-and-termination control circuit is coupled to receive a tristate control signal, a termination control signal, and an input data signal. The driver-and-termination control circuit selects a drive mode, tristate mode, or termination mode in response to the tristate control signal and the termination control signal. The driver-and-termination control circuit drives a first data signal to the pull-up driver and drives a second data signal to the pull-down driver. The first and second data signals have equal logic states in the drive mode and have opposite logic states in the tristate and termination modes.

20 Claims, 7 Drawing Sheets

– 1 –

INTEGRATED DRIVER AND TERMINATION CIRCUIT

TECHNICAL FIELD

The disclosure generally relates to input/output driver circuits.

BACKGROUND

Discontinuity of impedance along a signal transmission line can cause reflections and create noise in a signal. Termination impedance is used to match impedance at points in the signal transmission line. Placing a suitable termination impedance at a point on the transmission line at which the transmission line would otherwise have an impedance discontinuity can equalize the impedance across the transmission line and eliminate unwanted signal reflection.

Termination impedance is often provided by resistors, and in some applications the resistors are placed on the printed circuit board (PCB) on which a semiconductor die or package is mounted. However, resistors placed on a PCB may not remove all reflections, and the resistors can complicate wiring on the motherboard. On-die termination (ODT) is an approach in which termination resistors are placed on the semiconductor die instead of on the PCB. ODT can reduce the number of resistor elements and wiring on the PCB, as well as eliminate the reflections that PCB-based termination cannot.

SUMMARY

A disclosed circuit arrangement includes a pull-up leg and a pull-down leg. The pull-up leg includes a pull-up pre-driver and a pull-up driver coupled to the pull-up pre-driver. The pull-down leg includes a pull-down pre-driver and a pull-down driver coupled to the pull-down pre-driver. An input/output pad is coupled between the pull-up driver and pull-down driver, and a driver-and-termination control circuit is coupled to the pull-up pre-driver and to the pull-down pre-driver. The driver-and-termination control circuit is further coupled to receive a tristate control signal, a termination control signal, and an input data signal. The driver-and-termination control circuit is configured to select a drive mode, tristate mode, or termination mode in response to the tristate control signal and the termination control signal. The driver-and-termination control circuit drives a first data signal to the pull-up pre-driver and drives a second data signal to the pull-down pre-driver. The first and second data signals have equal logic states in the drive mode and have opposite logic states in the tristate and termination modes.

A disclosed integrated circuit package includes a semiconductor die and programmable logic circuitry disposed on the semiconductor die. An input/output circuit is disposed on the semiconductor die and is coupled to the programmable logic circuitry. The input/output circuit includes a pull-up leg and a pull-down leg. The pull-up leg includes a pull-up pre-driver and a pull-up driver coupled to the pull-up pre-driver. The pull-down leg includes a pull-down pre-driver and a pull-down driver coupled to the pull-down pre-driver. An input/output pad is coupled between the pull-up driver and pull-down driver. A first resistor is coupled between the pull-up driver and the input/output pad, and a second resistor is coupled between the pull-down driver and the input/output pad. A driver-and-termination control circuit is coupled to the pull-up pre-driver and to the pull-down pre-driver. The driver-and-termination control circuit is further coupled to receive a tristate control signal, a termination control signal, and an input data signal. The driver-and-termination control circuit is configured to select a drive mode, tristate mode, or termination mode in response to the tristate control signal and the termination control signal. The driver-and-termination control circuit drives a first data signal to the pull-up pre-driver and drives a second data signal to the pull-down pre-driver. The first and second data signals have equal logic states in the drive mode and have opposite logic states in the tristate and termination modes.

Other features will be recognized from consideration of the Detailed Description and Claims, which follow.

BRIEF DESCRIPTION OF THE DRAWINGS

Various aspects and features of the disclosed implementations will become apparent upon review of the following detailed description and upon reference to the drawings in which.

DETAILED DESCRIPTION

Figure 1:
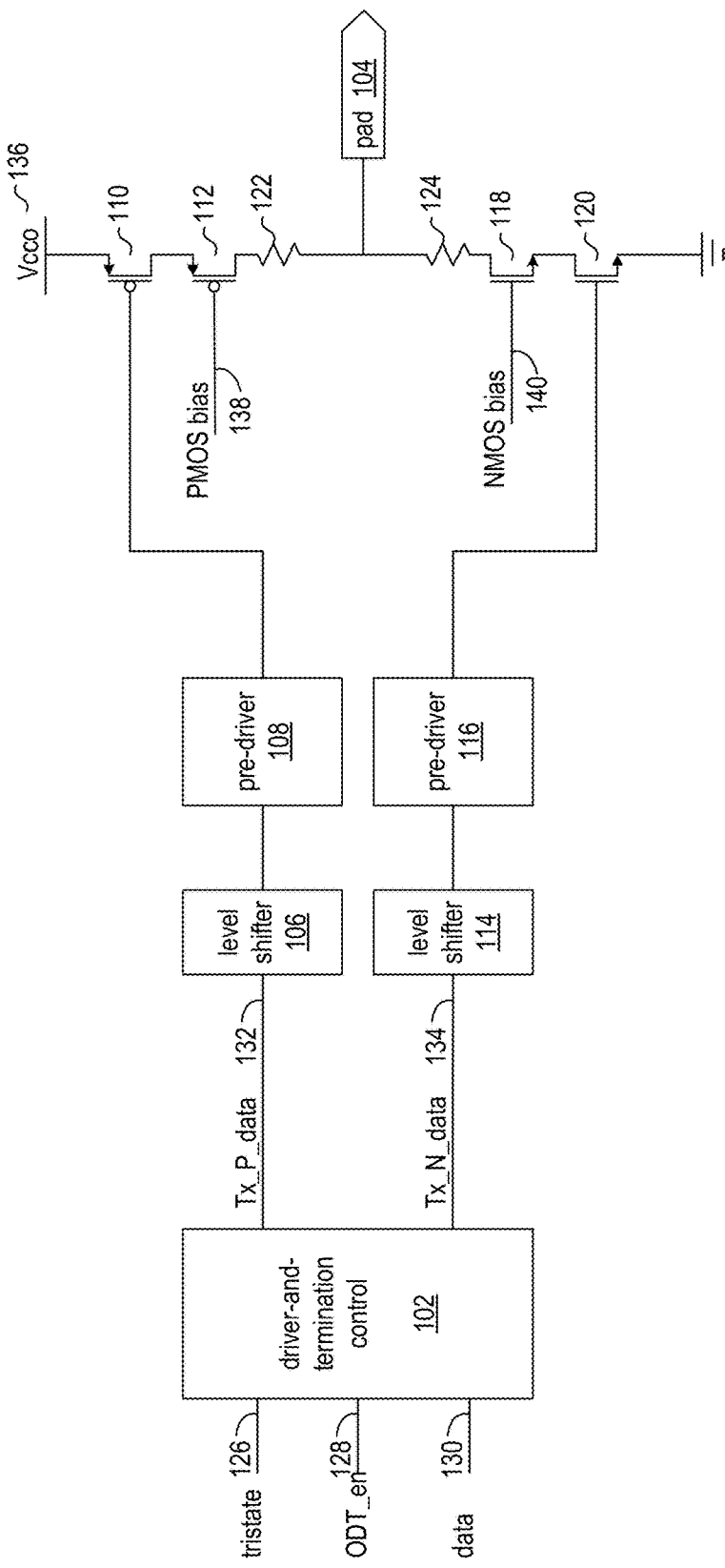
FIG. 1 shows a circuit arrangement having combined driver and termination control circuitry and combined pull-up and pull-down legs that implement both a driver and termination impedance.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

Programmable input/output circuits (IOs), such as those found in programmable integrated circuits (ICs), support a wide range of supply voltages. For example, the supply voltage for the IOs can range from 1.2 to 3.3v in some programmable ICs. In addition, the IOs support a variety of 10 standards, such as LVCMOS, GPIO, SSTL, and HSTL. For memory supported standards, such as SSTL, on-die termination (ODT) is employed in receive mode to improve performance and reduce space requirements on the motherboard. Driver linearity is important for signal integrity, and a driver can be designed to include a resistor improved linearity. Programmable IOs having a wide range of supply voltages have implemented ODT and driver circuitry as separate blocks, which can occupy a sizable area on a semiconductor die in programmable ICs having hundreds of IOs.

ODT can be paired with driver circuitry connected to an input/output (I/O) pad of a semiconductor die. When the I/O pad is used in transmission mode, an ODT control circuit tristates the ODT leg, which effectively disables the ODT leg. When the I/O pad is used in receive mode, the ODT leg is enabled and a driver control circuit tristates the driver leg, which effectively disables the driver leg.

The disclosed circuitry provides both driver and ODT circuitry and reduces the area required by separate driver and ODT legs. The driver and ODT circuitry has MOS transistors that tolerate a 1.8 v supply voltage and are operable within a wide range of supply voltages (1.2 v-3.3 v). In addition, the disclosed circuitry improves linearity of the pull-up and pull-down voltage-current characteristics of the driver, and reduces the spread between fast process-voltage-temperature (PVT) and slow PVT corners for both pull-up and pull-down currents at the I/O pad.

In one implementation, driver control and ODT control are combined into a driver-and-termination control circuit, and separate driver and ODT legs are combined into pull-up and pull-down legs that are controlled by the driver-and-termination control circuit. The driver-and-termination control circuit inputs a tristate control signal, a termination control signal, and an input data signal. The driver-and-termination control circuit selects a drive mode, tristate mode, or termination mode in response to the tristate control signal and the termination control signal, drives a first data signal to the pull-up leg, and drives a second data signal to the pull-down leg. The first and second data signals have equal logic states in the drive mode and have opposite logic states in the tristate and termination modes.

The pull-up leg can include a pull-up pre-driver and a pull-up driver coupled to the pull-up pre-driver, and the pull-down leg can include a pull-down pre-driver and a pull-down driver coupled to the pull-down pre-driver. An I/O pad can be coupled between the pull-up driver and the pull-down driver, with a resistor connected between the I/O pad and the pull-up driver and another resistor connected between the I/O pad and the pull-down driver. The pull-up and pull-down legs can further include level shifters coupled between the driver-and-termination control circuit and pre-drivers.

FIG. 1 shows a circuit arrangement having combined driver and termination control circuitry and combined pull-up and pull-down legs, all disposed on a semiconductor die. The combined circuitry selectably provides a driver or a termination impedance. The driver and termination control circuit 102 controls the impedance at I/O pad 104 through a pull-up leg and a pull-down leg. The pull-up leg includes level shifter 106, pull-up pre-driver 108, and a pull-up driver that includes PMOS transistors 110 and 112. The pull-down leg includes level shifter 114, pull-down pre-driver 116, and a pull-down driver that includes NMOS transistors 118 and 120. Termination impedance can be provided by resistor 122 connected between the I/O pad 104 and PMOS transistor 112 of the pull-up driver, and resistor 124 connected between the I/O pad 104 and NMOS transistor 118 of the pull-down driver.

The driver-and-termination control circuit 102 controls the states of the data signals, Tx_P_data 132 and Tx_N_data 134 in response to the states of the tristate control signal ("tristate") 126, termination control signal 128 ("ODT_en"), and data signal 130. The driver-and-termination control circuit 102 operates the pull-up leg and pull-down leg in either a drive mode, tristate mode, or termination mode based on the states of the tristate control signal 126 and ODT_en signal 128. The state of data signal Tx_P_data 132 is equal to the state of the Tx_N_data signal 134 in the drive mode, and state of data signal Tx_P_data 132 is opposite the state of the Tx_N_data signal 134 in the tri-state and termination modes.

Supply voltage Vcco 136 is connected to PMOS transistor 110 of the pull-up driver, and NMOS transistor 120 of the pull-down driver is connected to ground. The output of pull-up pre-driver 108 is connected to the gate of PMOS transistor 110, and the output of pull-down pre-driver 116 is connected to the gate of NMOS transistor 120. The gate of PMOS transistor 112 is connected to PMOS bias 138, and the gate of NMOS transistor 118 is connected to NMOS bias 140. Whereas PMOS bias 138 and NMOS bias 140 are safe bias voltages that protect the MOS transistors when the circuitry is operating with 2.5 v and 3.3 v supply voltages.

Figure 2:
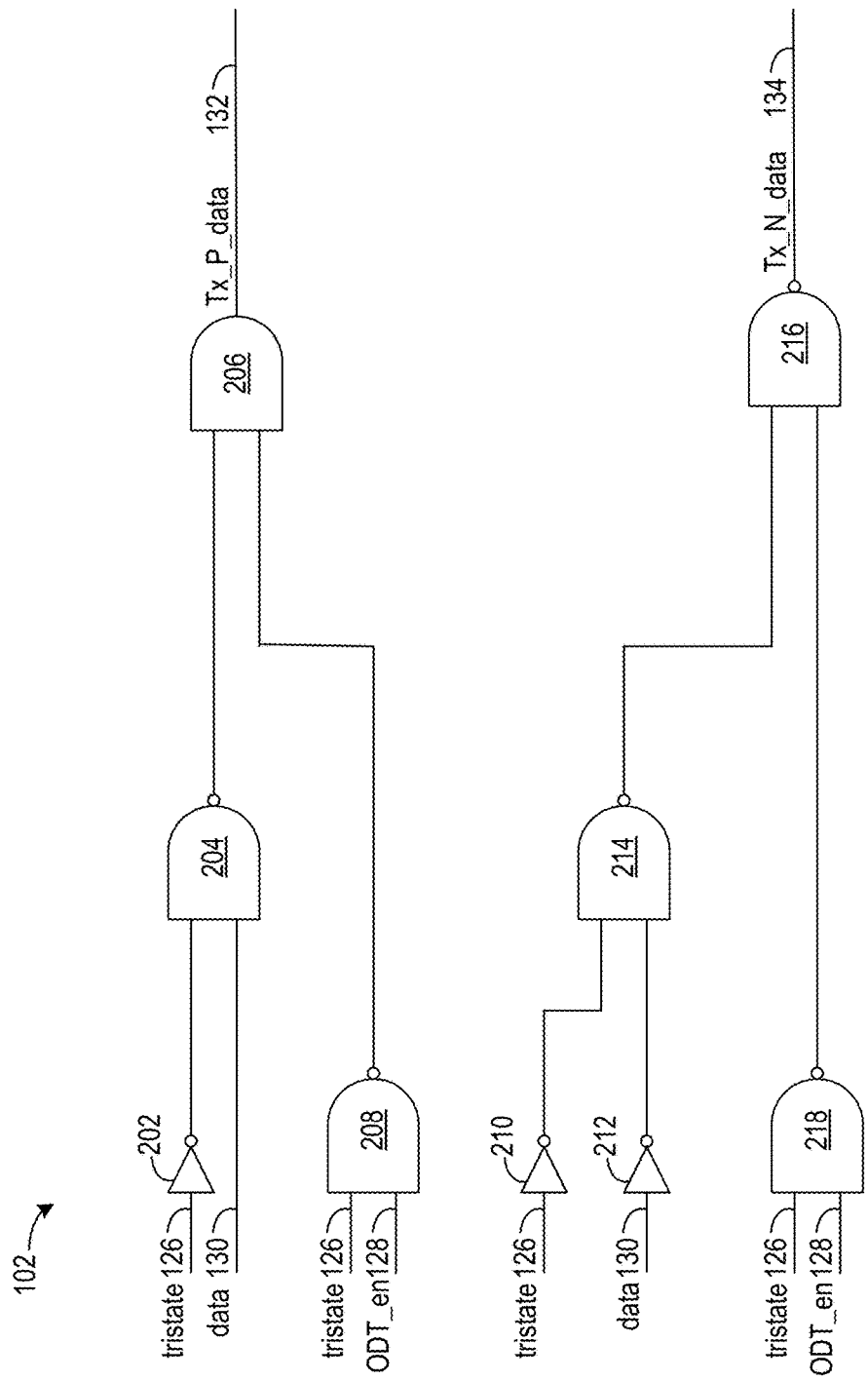
FIG. 2 shows a logic circuit implementation of the driver-and-termination control circuit.

FIG. 2 shows a logic circuit implementation of the driver-and-termination control circuit 102. The driver-and-termination control circuit generates Tx_P_data signal 132 and Tx_N_data signal 134 based on the states of the tristate signal 126, ODT_en signal 128, and data signal 130. Table 1 shows the states of the Tx_P_data signal and the Tx_N_data signal, along with the associated mode based on the states of the tristate, ODT_en, and data signals.

TABLE 1

| tristate | ODT_en | data | Tx_P_data | Tx_N_data | mode |
|---|---|---|---|---|---|
| 0 | x | 0 | 1 | 1 | drive |
| 0 | x | 1 | 0 | 0 | drive |
| 1 | 0 | x | 1 | 0 | tristate |
| 1 | 1 | x | 0 | 1 | termination |

The driver-and-termination control circuit selects the drive mode in response to the tristate signal having a logic 0 state. The Tx_P_data signal and the Tx_N_data signal have equal logic states of logic 1 when the data signal has a logic 0 state, and the Tx_P_data signal and the Tx_N_data signal have equal logic states of logic 0 when the data signal has a logic 1 state.

The driver-and-termination control circuit selects the tristate mode in response to the tristate signal having a logic 1 state and the ODT_en signal having a logic 0 state. In the tristate mode, the driver-and-termination control circuit forces the Tx_P_data signal to logic 1 and the Tx_N_data signal to logic 0.

The driver-and-termination control circuit selects the termination mode in response to the tristate signal having a logic 1 state and the ODT_en signal having a logic 1 state. In the termination mode, the driver-and-termination control circuit forces the Tx_P_data signal to logic 0 and the Tx_N_data signal to logic 1.

In the logic circuit of FIG. 2, the tristate signal 126 is input to inverter 202, and the output signal from the inverter, along with the data signal 130, are input to NAND gate 204. The output signal from NAND gate 204 is input to AND gate 206, which also inputs the output signal from NAND gate 208. NAND gate 208 inputs the tristate signal 126 and ODT_en signal 128. The output signal of AND gate 206 is the Tx_P_data signal 132.

The tristate signal 126 is input to inverter 210, and the data signal 130 is input to inverter 212. The output signals from the inverters 210 and 212 are input to the NAND gate 214, and the output signal from the NAND gate 214 is input to NAND gate 216. The tristate signal and ODT_en signal are input to NAND gate 218, and the output signal from NAND gate 218 is input to the NAND gate 216. The output signal of NAND gate 216 is the Tx_N_data signal 134.

Figure 3:
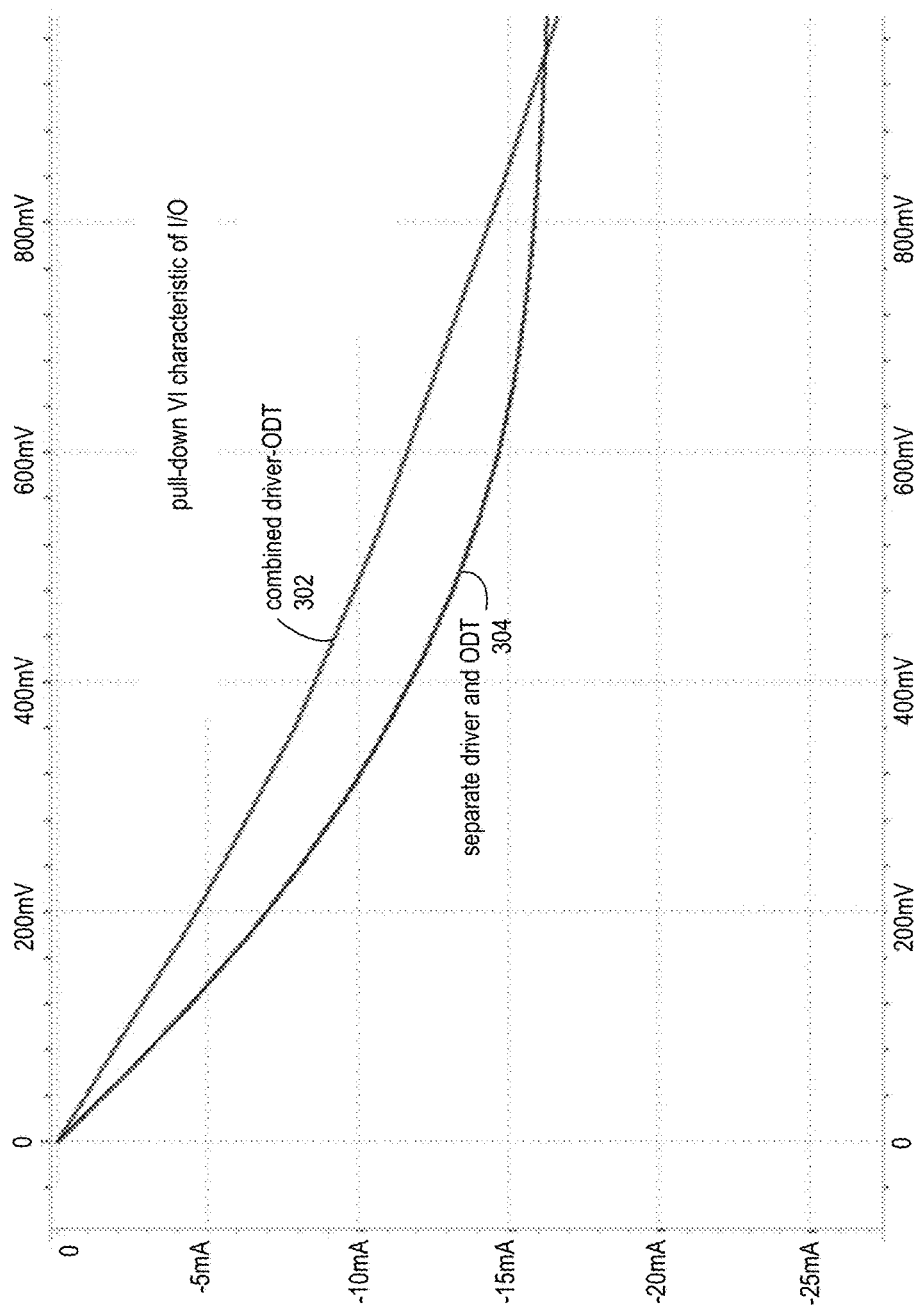
FIG. 3 shows the pull-down voltage-current characteristic curves at the I/O pad for the combined driver-ODT circuitry and for I/O circuitry having separate driver and ODT legs.
Figure 4:
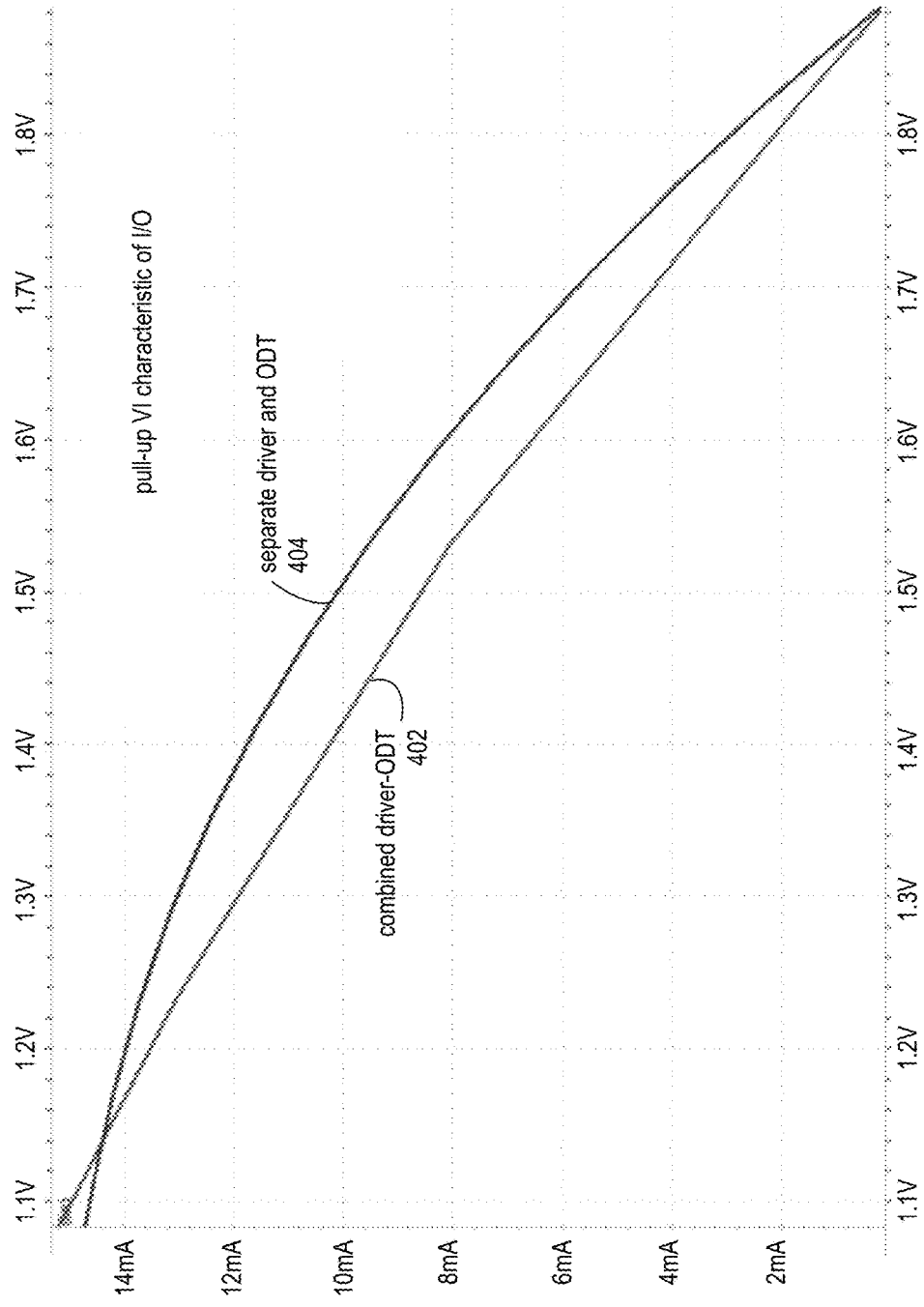
FIG. 4 shows the pull-up voltage-current characteristic curves at the I/O pad for the combined driver-ODT circuitry and for I/O circuitry having separate driver and ODT legs.

Integration of the ODT with the driver circuitry improves voltage-current linearity of the driver as shown by FIGS. 3 and 4. The horizontal axes show voltage levels in millivolts (mV), and the vertical axes show current levels in milliamps (mA). FIG. 3 shows the pull-down voltage-current characteristic curves at the I/O pad for the combined driver-ODT circuitry and for I/O circuitry having separate driver and ODT legs. Curve 302 shows the pull-down VI characteristic of I/O for the combined driver-ODT circuitry, and curve 304 shows the pull-down VI characteristic of I/O for the I/O circuitry having separate driver and ODT legs.

FIG. 4 shows the pull-up voltage-current characteristic curves at the I/O pad for the combined driver-ODT circuitry and for I/O circuitry having separate driver and ODT legs. Curve 402 shows the pull-up VI characteristic of I/O for the combined driver-ODT circuitry, and curve 404 shows the pull-up VI characteristic of I/O for the I/O circuitry having separate driver and ODT legs.

Figure 5:
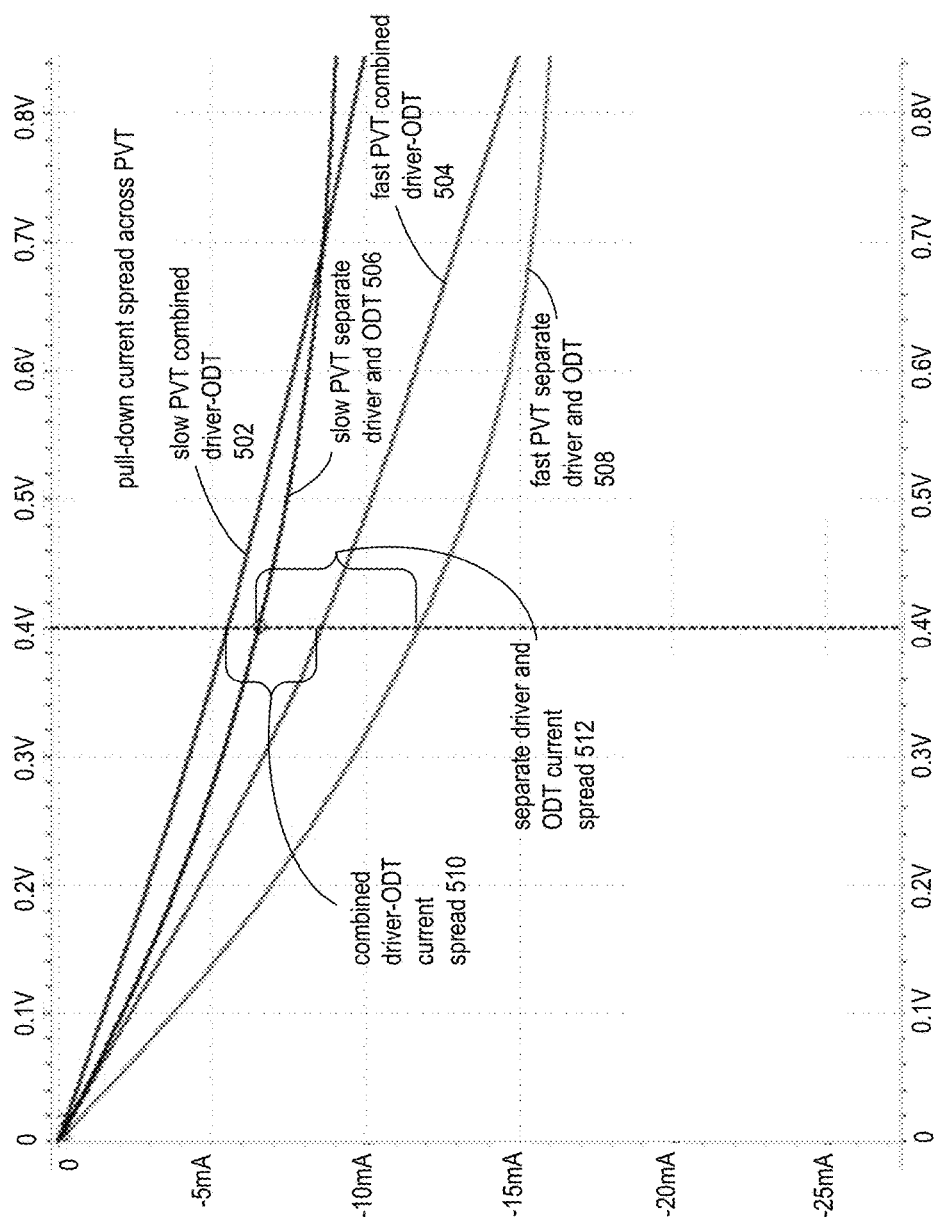
FIG. 5 shows pull-down current curves for fast and slow PVT corners of the combined driver-ODT circuitry and the I/O circuitry having separate driver and ODT legs.
Figure 6:
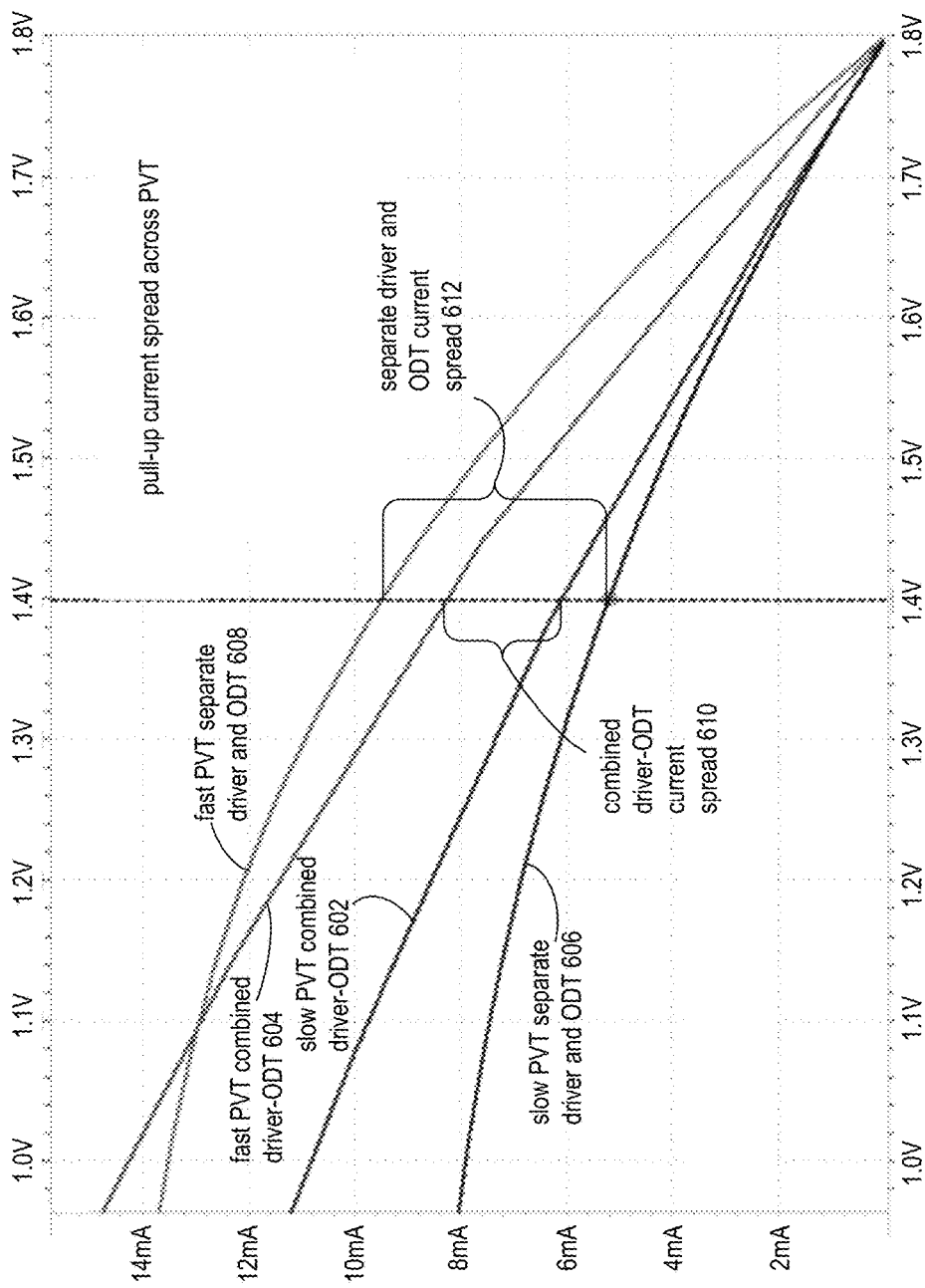
FIG. 6 shows pull-up current curves for fast and slow PVT corners of the combined driver-ODT circuitry and the I/O circuitry having separate driver and ODT legs.

Combing the resistors of the ODT with the driver circuitry improves overall linearity of the driver circuitry. Also, combining the ODT and driver circuitry provides less variation in drive strength across PVT corners. FIGS. 5 and 6 show that the combined driver and ODT circuitry reduces the current spread for fast and slow PVT corners. The reduced spread reduces peak current and crow bar current, which in turn minimizes ground bounce and power supply dips. Overall, the improved linearity and spread help to reduce reflections, thereby improving power and signal integrity.

FIG. 5 shows pull-down current curves for fast and slow PVT corners of the combined driver-ODT circuitry and the I/O circuitry having separate driver and ODT legs. Curve 502 shows the current drawn at a slow PVT corner for the combined driver-ODT circuitry, and curve 504 shows the current drawn at a fast PVT corner for the combined driver-ODT circuitry. Curve 506 shows the current drawn at a slow PVT corner for the I/O circuitry having separate driver and ODT legs, and curve 508 shows the current drawn at a fast PVT corner for the I/O circuitry having separate driver and ODT legs.

The graph shows that the current spread 510 between the slow PVT corner for the combined driver-ODT circuitry and the fast PVT corner for the combined driver-ODT circuitry is approximately 3 mA at 0.4 volts, and the current spread 512 between the slow PVT corner for the I/O circuitry having separate driver and ODT legs and the fast PVT corner for the I/O circuitry having separate driver and ODT legs is approximately 5 mA at 0.4 volts.

FIG. 6 shows pull-up current curves for fast and slow PVT corners of the combined driver-ODT circuitry and the I/O circuitry having separate driver and ODT legs. Curve 602 shows the current drawn at a slow PVT corner for the combined driver-ODT circuitry, and curve 604 shows the current drawn at a fast PVT corner for the combined driver-ODT circuitry. Curve 606 shows the current drawn at a slow PVT corner for the I/O circuitry having separate driver and ODT legs, and curve 608 shows the current drawn at a fast PVT corner for the I/O circuitry having separate driver and ODT legs.

The graph shows that the current spread 610 between the slow PVT corner for the combined driver-ODT circuitry and the fast PVT corner for the combined driver-ODT circuitry is approximately 2.1 mA at 1.4 volts, and the current spread 612 between the slow PVT corner for the I/O circuitry having separate driver and ODT legs and the fast PVT corner for the I/O circuitry having separate driver and ODT legs is approximately 4.2 mA at 1.4 volts.

The combined driver and ODT circuitry reduces area, reduces pad capacitance, and reduces power consumption relative to an implementation having separate driver and ODT circuit legs.

By eliminating the separate ODT circuit leg, the pre-drivers, drivers, and level shifters of the ODT leg can be eliminated. In an exemplary high-voltage I/O application, the driver can support a maximum drive strength of 16 mA @VOL/VOH=0.4. The separate ODT leg has 100 ohm pull-up and 100 ohm pull-down resistors and can provide up to 4 mA drive strength @VOL/VOH=0.4. The ODT can compensate 25% of driver drive strength, which saves approximately 25% of driver area per I/O pad, as the driver size is designed based on supported drive strength, and the area occupied by the driver is proportional to drive strength. The total amount of area saved at full chip level will be significant as a full chip may contain more than 100 I/O pads.

In general, contributions to pad capacitance are from driver circuitry, receiver circuitry, electric static discharge (ESD) circuitry, and ODT circuitry. The major contribution is from driver and ESD diodes. Because the driver and ODT are combined, driver contribution to pad capacitance is reduced by approximately 25%. In high-range I/O (HRIO) pad capacitance associated with the driver circuitry is ~2 pF. Approximately 0.5 pF pad capacitance can be reduced with the combined driver and ODT circuitry.

The combined driver and ODT circuitry can also significantly reduce dynamic power consumption for larger semiconductor die. The dynamic power of I/O is given by $P=\frac{1}{2}*C*V^2*F$, where, C=pad capacitance, V=supply voltage, and F=frequency of operation. In an exemplary use case, F=125 MHz and V=3.3 v. The saved dynamic power per I/O=$\frac{1}{2}*0.5e-12*(3.3)^2*125e^6$=340 u Watt/sec. For larger die consisting of 100 I/O pads, the amount of dynamic power saved=100*340 uw/sec=34 mWatt/sec.

Figure 7:
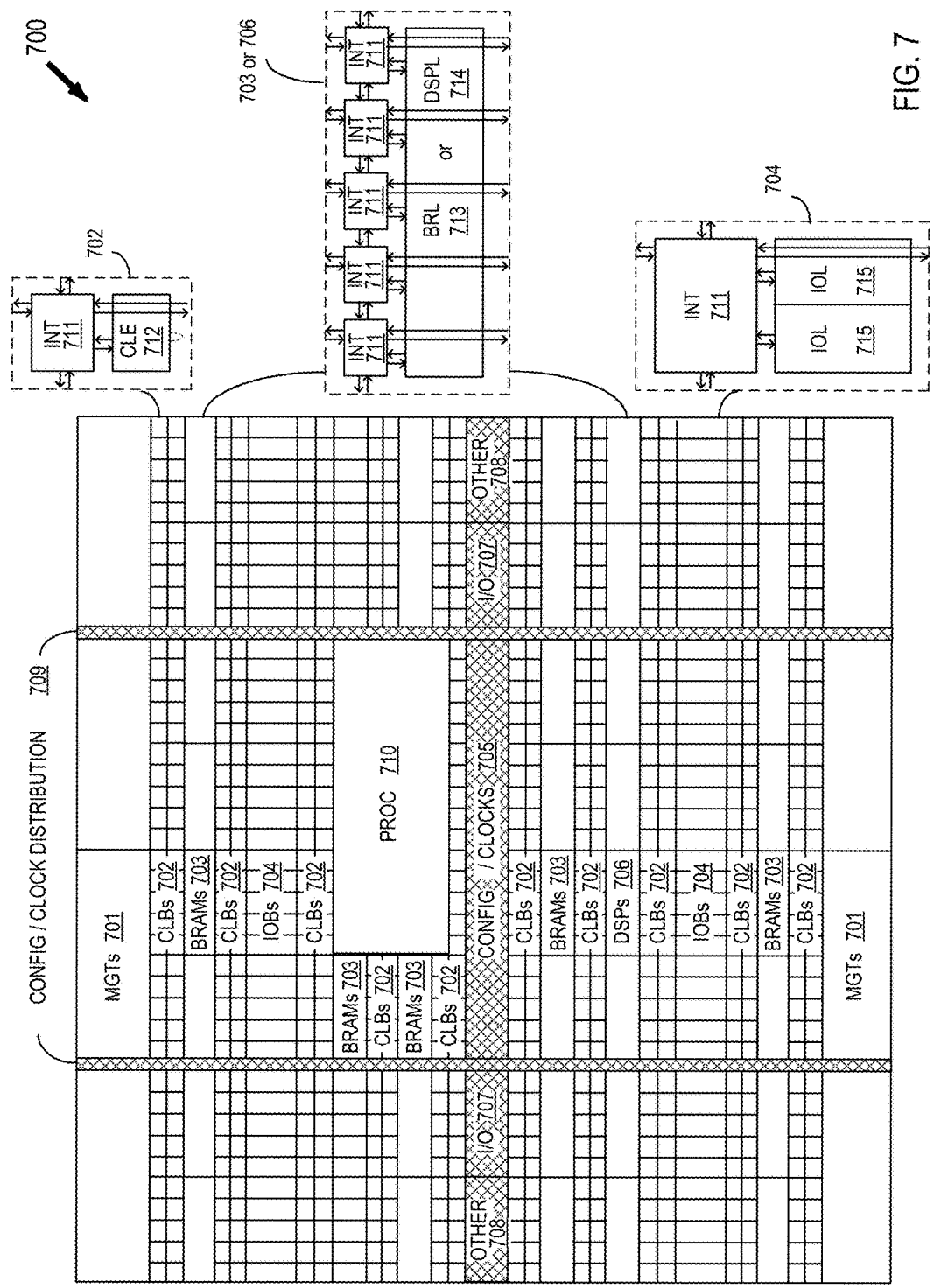
FIG. 7 shows a programmable integrated circuit (IC) on which the disclosed circuits and processes may be implemented.

FIG. 7 shows a programmable integrated circuit (IC) 700 on which the disclosed circuits and processes may be implemented. The programmable IC may also be referred to as a System On Chip (SOC) that includes field programmable gate array logic (FPGA) along with other programmable resources. The SOC can be implemented as a single semiconductor die or as multiple semiconductor die connected through an interposer and assembled in a package.

FPGA logic may include several different types of programmable logic blocks in the array. For example, FIG. 7 illustrates programmable IC 700 that includes a large number of different programmable tiles including multi-gigabit transceivers (MGTs) 701, configurable logic blocks (CLBs) 702, random access memory blocks (BRAMs) 703, input/output blocks (IOBs) 704, configuration and clocking logic (CONFIG/CLOCKS) 705, digital signal processing blocks (DSPs) 706, specialized input/output blocks (I/O) 707, for example, clock ports, and other programmable logic 708 such as digital clock managers, analog-to-digital converters, system monitoring logic, and so forth. Some programmable ICs having FPGA logic also include dedicated processor blocks (PROC) 710 and internal and external reconfiguration ports (not shown).

In some FPGA logic, each programmable tile includes a programmable interconnect element (INT) 711 having standardized connections to and from a corresponding interconnect element in each adjacent tile. Therefore, the programmable interconnect elements taken together implement the programmable interconnect structure for the illustrated FPGA logic. The programmable interconnect element INT 711 also includes the connections to and from the programmable logic element within the same tile, as shown by the examples included at the top of FIG. 7.

For example, a CLB 702 can include a configurable logic element CLE 712 that can be programmed to implement user logic, plus a single programmable interconnect element INT 711. A BRAM 703 can include a BRAM logic element (BRL) 713 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 706 can include a DSP logic element (DSPL) 714 in addition to an appropriate number of programmable interconnect elements. An IOB 704 can include, for example, two instances of an input/output logic element (IOL) 715 in addition to one instance of the programmable interconnect element INT 711. As will be clear to those of skill in the art, the actual I/O bond pads connected, for example, to the I/O logic element 715, are manufactured using metal layered above the various illustrated logic blocks, and typically are not confined to the area of the input/output logic element 715.

In the pictured embodiment, a columnar area near the center of the die (shown shaded in FIG. 7) is used for configuration, clock, and other control logic. Horizontal areas 709 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 7 include additional logic blocks that disrupt the regular columnar structure making up a large part of the programmable IC. The additional logic blocks can be programmable blocks and/or dedicated logic. For example, the processor block PROC 710 shown in FIG. 7 spans several columns of CLBs and BRAMs.

Note that FIG. 7 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 7 are purely exemplary. For example, in an actual programmable IC, more than one adjacent column of CLBs is typically included wherever the CLBs appear, to facilitate the efficient implementation of user logic.

Though aspects and features may in some cases be described in individual figures, it will be appreciated that features from one figure can be combined with features of another figure even though the combination is not explicitly shown or explicitly described as a combination.

The disclosed circuitry is thought to be applicable to a variety of integrated circuit (IC) applications having input/output driver circuitry. Other aspects and features will be apparent to those skilled in the art from consideration of the specification. It is intended that the specification and drawings be considered as examples only, with a true scope of the invention being indicated by the following claims.

What is claimed is:

1. A circuit arrangement comprising:
   a pull-up leg including:
      a pull-up pre-driver; and
      a pull-up driver coupled to the pull-up pre-driver;
   a pull-down leg including:
      a pull-down pre-driver; and
      a pull-down driver coupled to the pull-down pre-driver;
   an input/output pad coupled between the pull-up driver and pull-down driver; and
   a driver-and-termination control circuit coupled to the pull-up pre-driver, the pull-down pre-driver, and coupled to receive a tristate control signal, a termination control signal, and an input data signal, wherein the driver-and-termination control circuit is configured to:
      select a drive mode, tristate mode, or termination mode in response to the tristate control signal and the termination control signal,
      drive a first data signal to the pull-up pre-driver, and
      drive a second data signal to the pull-down pre-driver,
      wherein the first and second data signals have equal logic states in the drive mode and have opposite logic states in the tristate and termination modes.

2. The circuit arrangement of claim 1, further comprising:
   a first resistor coupled between the pull-up driver and the input/output pad; and
   a second resistor coupled between the pull-down driver and the input/output pad.

3. The circuit arrangement of claim 1, further comprising:
   a first level shifter coupled between the driver-and-termination control circuit and the pull-up pre-driver; and
   a second level shifter coupled between the driver-and-termination control circuit and the pull-down pre-driver.

4. The circuit arrangement of claim 1, wherein in the tristate mode a logic state of the first data signal is logic high and a logic state of the second data signal is logic low.

5. The circuit arrangement of claim 1, wherein in the termination mode, a logic state of the first data signal is logic low and a logic state of the second data signal is logic high.

6. The circuit arrangement of claim 1, wherein in the drive mode, the first and second data signals have equal logic states that are opposite a logic state of the input data signal.

7. The circuit arrangement of claim 1, wherein the driver-and-termination control circuit is configured to select the drive mode in response to a state of the tristate control signal.

8. The circuit arrangement of claim 1, wherein the driver-and-termination control circuit is configured to select the tristate mode in response to a state of the tristate control signal in combination with a state of the termination control signal.

9. The circuit arrangement of claim 1, wherein the driver-and-termination control circuit is configured to select the termination mode in response to a state of the tristate control signal in combination with a state of the termination control signal.

10. The circuit arrangement of claim 1, wherein the driver-and-termination control circuit is further configured to:
   select the drive mode in response to the tristate control signal having a logic 0 state, and in the drive mode drive the first and second data signals to a logic 1 state in response to the input data signal having a logic 0 state, and drive the first and second data signals to a logic 0 state in response to the input data signal having a logic 1 state;

select the tristate mode in response to a state of the tristate control signal being logic 1 and a state of the termination control signal being logic 0, and in the tristate mode drive the first and second data signals to a logic 0 state; and select the termination mode in response to a state of the tristate control signal being logic 1 and a state of the termination control signal being logic 1, and in the termination mode drive the first and second data signals to a logic 1 state.

11. The circuit arrangement of claim 1, further comprising:
a semiconductor die; and
programmable logic circuitry disposed on the semiconductor die;
wherein the driver-and-termination control circuit is coupled to the programmable logic circuitry, and the driver-and-termination control circuit, pull-up leg, pull-down leg, and input/output pad are disposed on the semiconductor die.

12. An integrated circuit package, comprising:
a semiconductor die;
programmable logic circuitry disposed on the semiconductor die; and
an input/output circuit disposed on the semiconductor die, coupled to the programmable logic circuitry and including:
a pull-up leg including:
a pull-up pre-driver; and
a pull-up driver coupled to the pull-up pre-driver;
a pull-down leg including:
a pull-down pre-driver; and
a pull-down driver coupled to the pull-down pre-driver;
an input/output pad coupled between the pull-up driver and pull-down driver;
a first resistor coupled between the pull-up driver and the input/output pad;
a second resistor coupled between the pull-down driver and the input/output pad; and
a driver-and-termination control circuit coupled to the pull-up pre-driver, the pull-down pre-driver, and coupled to receive a tristate control signal, a termination control signal, and an input data signal, wherein the driver-and-termination control circuit is configured to:
select a drive mode, tristate mode, or termination mode in response to the tristate control signal and the termination control signal,
drive a first data signal to the pull-up pre-driver, and drive a second data signal to the pull-down pre-driver, wherein the first and second data signals have equal logic states in the drive mode and have opposite logic states in the tristate and termination modes.

13. The integrated circuit package of claim 12, further comprising:
a first level shifter coupled between the driver-and-termination control circuit and the pull-up pre-driver; and
a second level shifter coupled between the driver-and-termination control circuit and the pull-down pre-driver.

14. The integrated circuit package of claim 12, wherein in the tristate mode a logic state of the first data signal is logic high and a logic state of the second data signal is logic low.

15. The integrated circuit package of claim 12, wherein in the termination mode, a logic state of the first data signal is logic low and a logic state of the second data signal is logic high.

16. The integrated circuit package of claim 12, wherein in the drive mode, the first and second data signals have equal logic states that are opposite a logic state of the input data signal.

17. The integrated circuit package of claim 12, wherein the driver-and-termination control circuit is configured to select the drive mode in response to a state of the tristate control signal.

18. The integrated circuit package of claim 12, wherein the driver-and-termination control circuit is configured to select the tristate mode in response to a state of the tristate control signal in combination with a state of the termination control signal.

19. The circuit arrangement of claim 12, wherein the driver-and-termination control circuit is further configured to:
select the drive mode in response to the tristate control signal having a logic 0 state, and in the drive mode drive the first and second data signals to a logic 1 state in response to the input data signal having a logic 0 state, and drive the first and second data signals to a logic 0 state in response to the input data signal having a logic 1 state;
select the tristate mode in response to a state of the tristate control signal being logic 1 and a state of the termination control signal being logic 0, and in the tristate mode drive the first and second data signals to a logic 0 state; and
select the termination mode in response to a state of the tristate control signal being logic 1 and a state of the termination control signal being logic 1, and in the termination mode drive the first and second data signals to a logic 1 state.

20. The integrated circuit package of claim 12, wherein the pull-up leg and the pull-down leg are operable at a supply voltage range of at least 1.1 volts.

* * * * *